(12) United States Patent
Lang et al.

(10) Patent No.: US 8,007,590 B2
(45) Date of Patent: Aug. 30, 2011

(54) ELECTRONIC DEVICE INCLUDING A GUEST MATERIAL WITHIN A LAYER AND A PROCESS FOR FORMING THE SAME

(75) Inventors: Charles D. Lang, Goleta, CA (US); Joseph Anthony Perrotto, Landenberg, PA (US); Thomas Patrick Daly, Aston, PA (US); James Nelson Tilton, Landenberg, PA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 750 days.

(21) Appl. No.: 11/833,446

(22) Filed: Aug. 3, 2007

(65) Prior Publication Data

US 2008/0182009 A1 Jul. 31, 2008

Related U.S. Application Data

(62) Division of application No. 11/026,732, filed on Dec. 30, 2004, now Pat. No. 7,268,006.

(60) Provisional application No. 60/835,583, filed on Aug. 4, 2006.

(51) Int. Cl.
*C23C 16/00* (2006.01)

(52) U.S. Cl. ...................... 118/715; 118/728

(58) Field of Classification Search .................. 118/500, 118/715, 728, 319, 320, 52; 206/308.1; 414/935
See application file for complete search history.

(56) References Cited

U.S. PATENT DOCUMENTS

| | | | |
|---|---|---|---|
| 6,189,238 B1 | 2/2001 | Dautartas et al. | |
| 6,230,895 B1 | 5/2001 | Laube | |
| 6,670,645 B2 | 12/2003 | Grushin et al. | |
| 2001/0016157 A1* | 8/2001 | Sundar | 414/217 |

FOREIGN PATENT DOCUMENTS

EP 0 591 085 A1 4/1994

OTHER PUBLICATIONS

PCT International Search Report and Written Opinion for International Application No. PCT/US2007/017360 dated Mar. 7, 2008.
CRC Handbook of Chemistry and Physics, 81$^{st}$ Edition, 2000-2001 (Book not Included).

* cited by examiner

*Primary Examiner* — Laura Edwards

(57) ABSTRACT

There is provided a portable substrate carrier enclosure. The carrier enclosure has a carrier support; a displaceable cover; spacers between the support and cover; a gas inlet; and a removable lid. There is also provided an assembly and a process for depositing an air-sensitive material onto a substrate using the portable substrate carrier enclosure.

3 Claims, 2 Drawing Sheets

ELECTRONIC DEVICE INCLUDING A GUEST MATERIAL WITHIN A LAYER AND A PROCESS FOR FORMING THE SAME

CROSS REFERENCE TO RELATED APPLICATION

This application is a division of U.S. application Ser. No. 11/026,732, filed Dec. 30, 2004, now U.S. Pat. No. 7,268,006, which claims the benefit of priority under 35 U.S.C. 119(e) from provisional U.S. Provisional Application Ser. No. 60/835,583, filed Aug. 4, 2006, which is incorporated by reference herein in its entirety.

BACKGROUND INFORMATION

1. Field of the Disclosure

This disclosure relates in general to enclosures for depositing air-sensitive materials.

2. Description of the Related Art

Electronic devices utilizing organic active materials are present in many different kinds of electronic equipment. In such devices, an organic active layer is sandwiched between two electrodes.

One type of electronic device is an organic light emitting diode ("OLED"). OLEDs are promising for display applications due to their high power-conversion efficiency and low processing costs. Such displays are especially promising for battery-powered, portable electronic devices, including cellphones, personal digital assistants, handheld personal computers, and DVD players. These applications call for displays with high information content, full color, and fast video rate response time in addition to low power consumption.

Process advantages can be achieved when one or more of the organic layers in the electronic device are formed by liquid deposition. However, many of the organic materials are sensitive to oxygen and/or moisture. The typical approach to avoiding contamination during printing is to place the entire printing operation in an inert environment. This approach reduces the economic advantage of printing vs. thermal evaporation. Process upsets and equipment maintenance require long purge times to control the process environment, both for safe entry by personnel and for restarting the process. Large volumes of gas must be treated, requiring significant investment.

There is a need for new processes to deposit such materials.

SUMMARY

There is provided a portable substrate carrier enclosure comprising:
  a carrier support;
  a displaceable cover;
  spacers between the support and cover; and
  a gas inlet.

In some embodiments, the substrate carrier enclosure further comprises a removable lid.

There is also provided an assembly for depositing an air sensitive material onto a substrate, said assembly comprising
  a portable substrate carrier enclosure, as described above, a material deposition device having a deposition stage, said deposition stage having a leading edge, a trailing edge, and two side edges, and
  a stationary cover attached to the liquid deposition device over the trailing edge of the deposition stage.

In some embodiments, the assembly further comprises curtain gas manifolds on one or both of the side edges of the deposition stage.

There is also provided a process for depositing an air sensitive material onto a substrate, said process comprising:
  a. providing a substrate carrier enclosure comprising:
     a carrier support;
     a displaceable cover;
     spacers between the support and cover; and
     a gas inlet;
  b. displacing the cover and placing the substrate on the carrier support;
  c. replacing the cover over the substrate on the carrier support;
  d. introducing an inert gas through the gas inlet at a substantially constant gas flow rate;
  e. partially displacing the cover to uncover a first portion of the substrate while maintaining the inert gas flow, and depositing the air sensitive material to the first portion of the substrate;
  f. repeating step e with $2^{nd}$ through $n^{th}$ portions of the substrate; and
  g. replacing the cover over the substrate and support while maintaining the gas flow.

In some embodiments, the substrate carrier enclosure further comprises a removable lid and the process further comprises after step g:
  h. placing the lid over the support while maintaining the gas flow, sealing the lid to the support, and then discontinuing the gas flow.

There is also provided a process for depositing an air-sensitive material onto a substrate, said process comprising:
  a. providing an assembly comprising
     a portable substrate carrier enclosure comprising
       a carrier support;
       a displaceable cover;
       spacers between the support and cover;
       a gas inlet;
     a material deposition device having a deposition stage, said deposition stage having a leading edge, a trailing edge, and two side edges, and
     a stationary cover attached to the liquid deposition device over the trailing edge of the deposition stage;
  b. displacing the cover and placing the substrate on the carrier support;
  c. replacing the cover over the substrate on the carrier support;
  d. introducing an inert gas through the gas inlet at a substantially constant gas flow rate;
  e. placing the carrier support at the leading edge of the deposition stage;
  f. moving the carrier support partially into the deposition stage and partially displacing the cover to uncover a first portion of the substrate in the deposition stage while maintaining the inert gas flow, and depositing the air sensitive material onto the first portion of the substrate;
  g. moving the carrier support further into the deposition stage and displacing the cover to uncover a second portion of the substrate in the deposition stage, while the first portion is moved past the trailing edge and under the stationary cover;
  h. repeating step g with $3^{rd}$ through $n^{th}$ portions of the substrate; and
  i. replacing the cover over the substrate and support while maintaining the gas flow.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
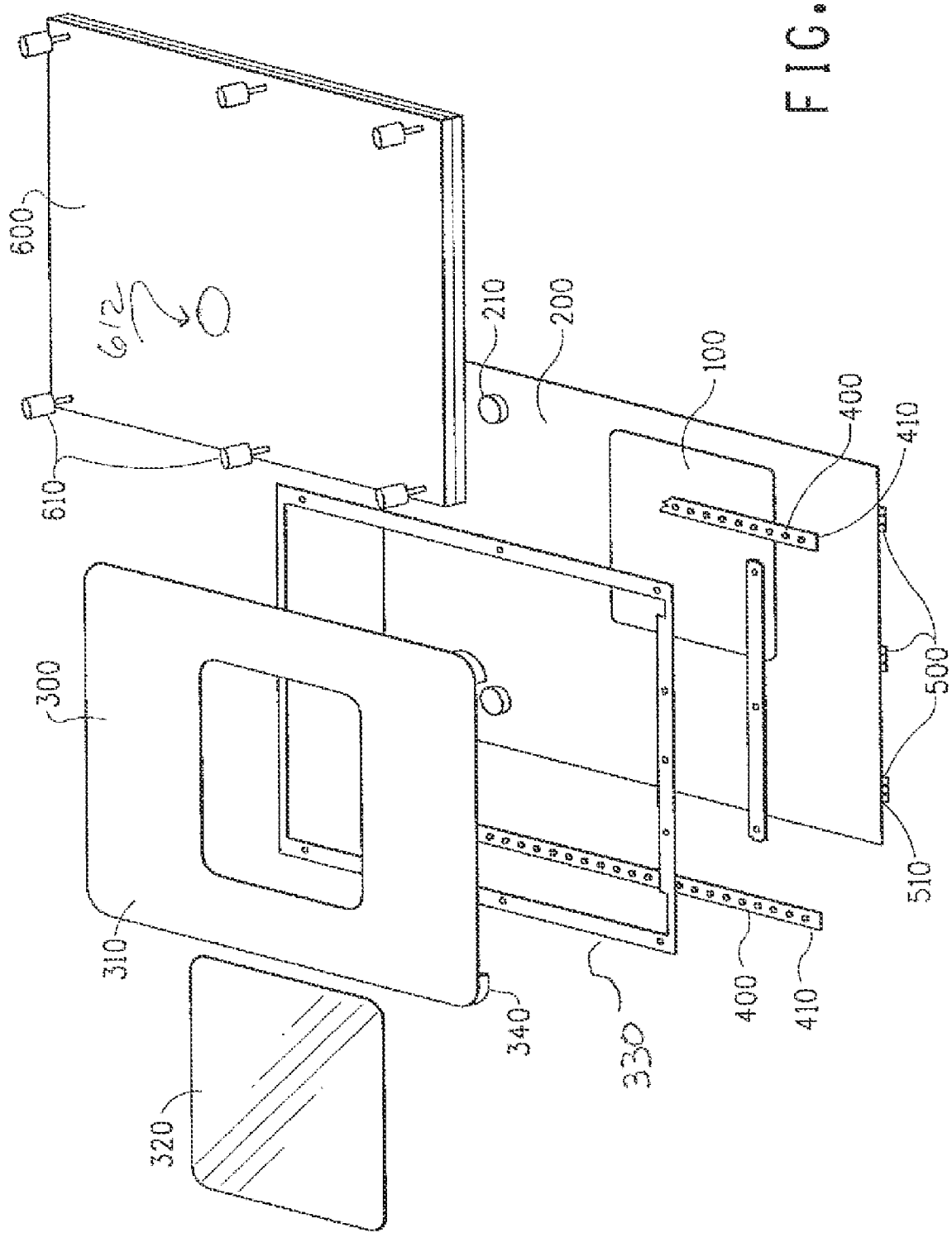
FIG. 1 includes an exploded view of a substrate carrier enclosure.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Substrate Carrier Enclosure, the Assembly, the Process, Organic Light-Emitting Diodes, and finally Examples.

1. Definitions and Clarification of Terms

Before addressing details of embodiments described below, some terms are defined or clarified.

The term "air-sensitive" when referring to a material, is intended to mean that the performance of the material is negatively affected by the presence of oxygen and/or moisture.

The term "substrate" is intended to mean a workpiece that can be either rigid or flexible and may be include one or more layers of one or more materials. The materials can include, but are not limited to, glass, polymer or other organic materials, metal, or ceramic materials or combinations thereof.

The term "deposition" is intended to include any conventional deposition technique, including vapor deposition, liquid deposition (continuous and discontinuous techniques), and thermal transfer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Substrate Carrier Enclosure

The portable substrate carrier enclosure comprises:
a carrier support;
a displaceable cover;
spacers between the support and cover;
a gas inlet; and
an optional removable lid.

The support is a planar, base material on which the substrate can be placed and carried. The support can be made of any stable material, including, but not limited to glass, polymer, metal or ceramic materials or combinations thereof. The term "stable" is intended to mean that the material does not interact with the substrate or the environment in which it is used. The support may have some flexibility, but, in general, the support is essentially rigid. The dimensions of the support are largely determined by liquid deposition equipment with which it will be used. In some embodiments, the support has a thickness of at least 1 mm; in some embodiments, at least 1 cm.

The displaceable cover is an essentially planar base material which overlies the support. By "displaceable" it is meant that the cover can be moved in a direction parallel to the plane of the support, resulting in areas of the support being uncovered. In some embodiments, the cover is moveable along the length of the support. The cover can be made of any stable material, including, but not limited to glass, polymer, metal or ceramic materials or combinations thereof. The cover may have some flexibility, but, in general, the cover is essentially rigid. The dimensions of the cover are slightly smaller than those of the support. In some embodiments, the cover has a thickness of at least 1 mm; in some embodiments, at least 1 cm. In some embodiments, at least a portion of the cover is transparent.

The spacers are present to separate the cover from the support. Any type of spacer may be used so long as it allows for the moving of the cover relative to the support. In some embodiments, the spacers are bearings. In some embodiments, there are four bearings as spacers. In some embodiments, the clearance between the displaceable cover and the support is designed to provide a controlled rate of gas egress from the surface of the support.

The gas inlet allows for an inert gas to be introduced into the carrier and to flow across the support. Any conventional gas inlet, such as a nozzle, can be used. The gas inlet is connected to a source of inert gas. Examples of inert gases include, but are not limited to, nitrogen, helium, and argon.

In some embodiments, the substrate carrier enclosure further comprises a removable lid. The optional lid, when attached, completely encloses at least a portion of the upper surface of the carrier support. The lid engages or substantially engages the support to enclose at least a portion of the upper surface of the carrier support protect the enclosed substrate during transport. The lid includes a base having at its periphery a band member perpendicular or substantially perpendicular and contiguous to the base. The base is typically planar but is not so limited, and can be dome-shaped for example. The band engages with the support, and may be sized to seat or reside in the support. Optionally the lid may include a handle on the base to aid in handling. The base and band member may be made of the same or different materials. The lid is held in place on the support using any conventional means, such as screws. Alternatively, the lid may include on the band a fastening device or member that temporarily couples the cover to the support. The lid can be made of any stable material, including, but not limited to glass, polymer, metal or ceramic materials or combinations thereof. The lid may have some flexibility, but, in general, the lid is essentially rigid. The base of the lid has an area and planar shape that is the same or substantially the same as an area and shape of the structure that is protected.

In some embodiments, the carrier further comprises a first gas manifold to distribute the gas from the gas inlet across the surface of the carrier support. In some embodiments, the carrier comprises more than one manifold to distribute the inert gas. The gas supply is controllable, and can be different to each manifold. In some embodiments, the carrier comprises first and second gas manifolds. The first gas manifold is at one end of the support and the second gas manifold is at the opposite end. A gas supply line is present to supply inert gas from the gas inlet to the second gas manifold. In these embodiments, gas flows across the support from both ends of the carrier, providing better control of the environment over the support.

In some embodiments, the carrier further comprises locating pins on the support. The locating pins can be used for precisely locating the substrate on the carrier support. The locating pins may be fixed in place, or movable parallel to the surface of the carrier for centering and orienting the substrate.

In some embodiments, the carrier further comprises movable lift pins for elevating the substrate above the surface of the carrier. The lift pins allow a robotic arm to reach under the substrate. The lift pins may also be locating pins, thereby including the functionality of precisely locating the substrate on the carrier support.

In some embodiments, the lid further comprises a valve. The lid can be placed over the support and attached with the valve open, while the gas is flowing. In this way the pressure within the enclosed support is maintained approximately the same. Once the lid is attached, the gas flow can be turned off and the valve closed.

An exploded view of one example of a portable substrate carrier and enclosure is shown in FIG. 1. A substrate 100 is on the upper surface of a carrier support 200. The support further comprises end-stops 210. A displaceable cover 300 has an opaque portion 310 and a transparent portion 320. The opaque portion will be placed on a framework 330. The transparent portion will be placed in the opening of the opaque portion. The cover further comprises end pieces 340. These are designed to contact end-stops 210 when the cover is moving across the support, and prevent it from moving completely off the support. Spacers 400 are positioned to move along a track 410, which will be attached to the outer edges of the support 200. Gas inlets 500 will be attached to the support at positions 510. The optional lid 600, having an optional valve 612, is attached to the support by screws 610.

3. Assembly

The assembly for applying an air sensitive material onto a substrate comprises:

a portable substrate carrier enclosure, as described above, a material deposition device having a deposition stage, said deposition stage having a leading edge, a trailing edge, and two side edges, and a stationary cover attached to the deposition device over the trailing edge of the deposition stage.

The material deposition device can be any device capable of depositing the air-sensitive material in the desired pattern. In some embodiments, the device is a liquid deposition device and the air-sensitive material is deposited as a liquid. The term "liquid" is intended to include single liquid materials and combinations of liquid materials, and these may be solutions, dispersions, suspensions and emulsions. Liquid deposition techniques include continuous and discontinuous techniques. Continuous deposition techniques which can be used with the substrate carrier described herein, include but are not limited to, gravure coating, curtain coating, slot-die coating, spray coating, and continuous nozzle coating. Discontinuous deposition techniques include, but are not limited to, ink jet printing, gravure printing, and screen printing.

The deposition device includes a deposition stage. This is the area in which the deposition takes place. It may constitute the major portion of the overall device, or only a small portion. The stage may be of any shape. In some embodiments, the deposition stage is essentially rectangular. The deposition stage has a leading edge and a trailing edge. The substrate carrier with the substrate is moved first to the leading edge of the deposition stage, moved across the stage, and then moved beyond the stage past the trailing edge. The deposition stage further has two side edges. In some embodiments, the side edges are essentially perpendicular to the leading and trailing edges.

A stationary cover is attached to the deposition device over the trailing edge of the deposition stage. By "stationary" it is meant that the cover does not move relative to the deposition device. It may be detachable or may be attached permanently to the device. The stationary cover is positioned so that it is over the substrate carrier as it exits the deposition stage from the trailing edge. In some embodiments, the stationary cover is positioned so that the separation distance between the stationary cover and the carrier support is substantially the same as the separation distance between the displaceable cover on the carrier and the carrier support.

Figure 2:
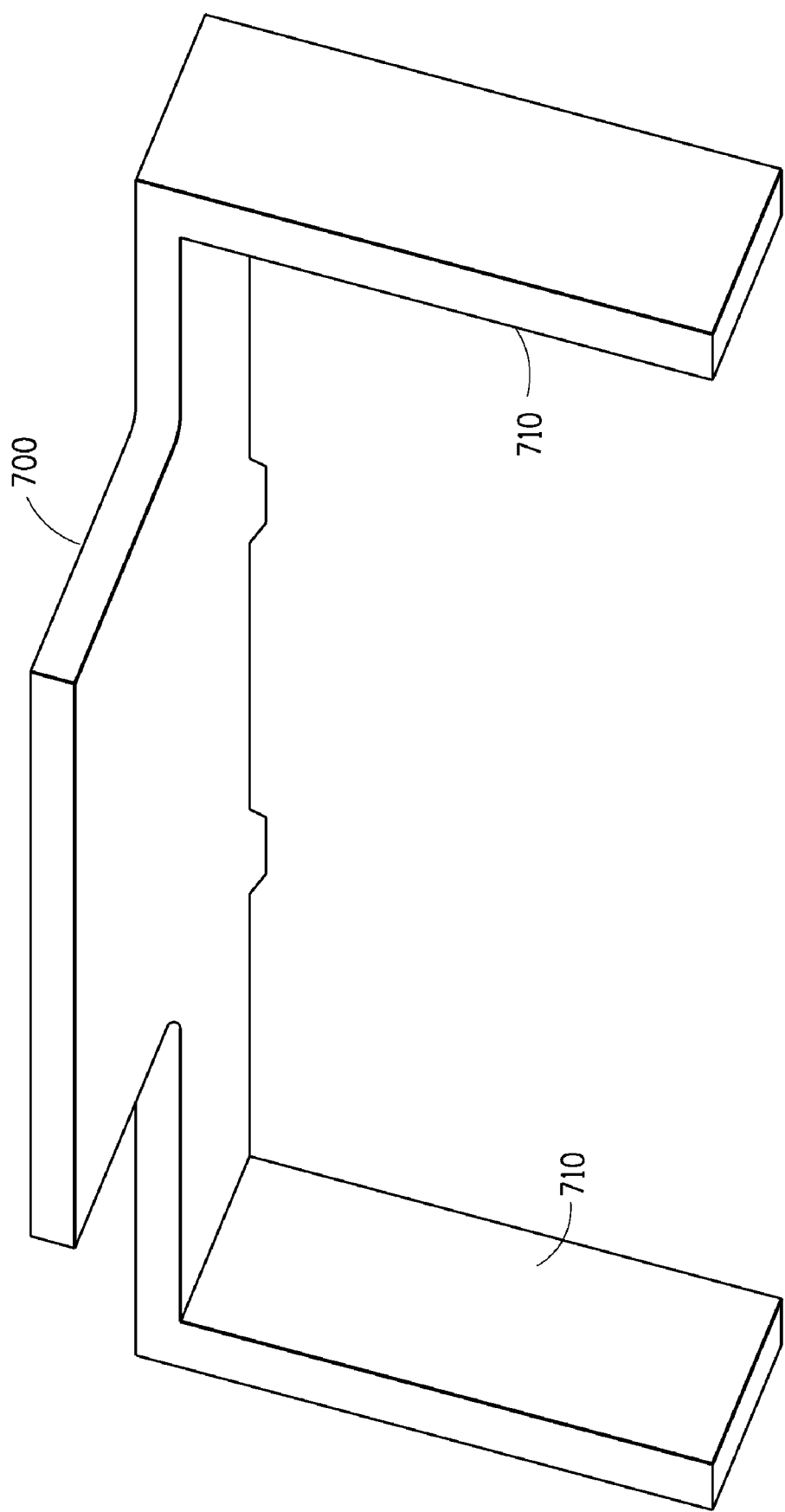
FIG. 2 includes a drawing of a stationary cover.

One example of a stationary cover is shown in FIG. 2. The stationary cover 700 is attached to a deposition device by supports 710. The substrate carrier is passed underneath the stationary cover.

In some embodiments, the assembly further includes inert gas curtain manifolds on one or both sides of the deposition stage. These help to control the environment over the deposition stage.

4. Process

The process for depositing an air sensitive material onto a substrate comprises:

a. providing a substrate carrier comprising:
   a carrier support;
   a displaceable cover;
   spacers between the support and cover;
   a gas inlet; and
   an optional removable lid;

b. removing the lid, if present, displacing the cover and placing the substrate on the carrier support;
c. replacing the cover over the substrate on the carrier support;
d. introducing an inert gas through the gas inlet at a substantially constant gas flow rate;
e. partially displacing the cover to uncover a first portion of the substrate while maintaining the inert gas flow, and depositing the air sensitive material to the first portion of the substrate;
f. repeating step e with $2^{nd}$ through $n^{th}$ portions of the substrate; and
g. optionally placing the lid over the support while maintaining the gas flow, sealing the lid to the support, and then discontinuing the gas flow.

The carrier substrate and enclosure is opened to allow the placement of the substrate onto the carrier support. The lid, if present, is removed and the cover is displaced so that the support is accessible. In some embodiments, the substrate is placed in a specific position on the support by aligning it with locating pins or other alignment marks. The cover is then replaced over the support and substrate.

The portable substrate carrier containing the substrate can then be moved to the equipment where the deposition of the air-sensitive material will be carried out. In some embodiments the liquid containing the air-sensitive material is deposited by ink jet printing. In some embodiments the liquid containing the air-sensitive material is deposited by continuous nozzle coating.

An inert gas is introduced through the gas inlet at a substantially constant gas flow rate. In some embodiments, there is more than one gas inlet, and gas is introduced into all of them. The gas flow rate for each inlet may be the same or different, however the gas flow rates remain substantially constant so that the environment between the carrier support and carrier cover remains substantially constant.

In some embodiments, the substrate carrier with the substrate, is then passed through the deposition stage. For example, it may be passed under the ink jet print head(s). In order to allow deposition of the air-sensitive material onto the substrate, the carrier cover is partially displaced in the deposition stage to uncover just a first portion of the substrate. The air-sensitive material is applied in the desired pattern over the first portion of the substrate. The carrier is then advanced and the cover displaced to uncover a second portion of the substrate. The air-sensitive material is applied in the desired pattern over the second portion of the substrate. This is repeated for the $3^{rd}$, $4^{th}$ . . . and $n^{th}$ portions of the substrate, where the first through $n^{th}$ portions represent the total area of the substrate on which the air-sensitive material is to be deposited.

After the air-sensitive material has been deposited on the $n^{th}$ portion of the substrate, the carrier cover is replaced over the substrate and support. The gas flow is maintained.

When a stationary cover is present on the deposition device, each portion of the substrate is covered by the stationary cover after deposition. For example, when the second portion of the substrate is uncovered for deposition, the first portion is advanced beyond the deposition stage past the trailing edge so that it is covered by the stationary cover. Thus each portion of the substrate is first covered by the carrier cover, it is uncovered while the air-sensitive material is deposited, and then it is covered by the stationary cover. The combination of the stationary cover and the displaceable carrier cover creates an aperture having a fixed width under which the substrate is moved. Having a fixed aperture width results in a more constant flow rate over the substrate surface.

When one or more gas curtain manifolds are present on the side edges of the deposition stage, an inert gas is introduced into these in order to further control the environment during deposition.

In some embodiments, after deposition a lid is then placed over the support and secure in place, again while the gas flow is maintained. If the lid has a gas valve, it is open while the gas flow is on. The gas flow is then discontinued and the gas valve on the lid is closed. The substrate carrier enclosure can then be moved to different equipment for further processing, as desired.

In an automated process the optional lid may not be required. In this case the substrate can be transported to a subsequent processing stop in the substrate carrier enclosure. It can then be removed in an inert environment for further processing. In this instance the gas flow may optionally be continued to protect the substrate.

In some embodiments, a second air-sensitive material is deposited on the substrate using the same deposition equipment. In this case, carrier cover is replaced and the deposition process begun again. The carrier lid, if present, is not applied until all of the substrate is to be moved to different equipment.

4. Organic Light-Emitting Diodes

One type of device which can be made using the substrate carrier enclosure described herein is an organic light-emitting diode ("OLED"). An OLED includes the following layers, in order: an anode; one or more hole injection/transport layers to facilitate the injection and transport of holes from the anode layer; an electroluminescent layer; one or more optional electron injection/transport layers; and a cathode layer. A supporting member can be present adjacent the anode or the cathode. The supporting member is frequently present adjacent the anode. Materials that are useful for the various layers in OLEDs are well known.

In most full color OLEDs, the device has three sets of subpixel areas. The electroluminescent layer is divided into first subpixel areas comprising a first electroluminescent material, second subpixel areas comprising a second electroluminescent material, and third subpixel areas comprising a third electroluminescent material. Upon the application of a voltage across the device, first subpixel areas emit light of a first color, second subpixel areas emit light of a second color, and third subpixel areas emit light of a third color.

In some embodiments, the substrate carrier enclosure described herein is used for the deposition one or more of the hole injection/transport layers. In some embodiments, the substrate carrier enclosure is used for the deposition of one or more of the electroluminescent materials. In some embodiments, the substrate carrier enclosure described herein is used for the deposition one or more of the electron injection/transport layers.

EXAMPLES

The concepts described herein will be further described in the following examples, which do not limit the scope of the invention described in the claims.

Example 1

Example 1 demonstrates the use of a portable substrate carrier enclosure for the deposition of an air-sensitive cyclometalated iridium complex. Such complexes have been described in, for example, Grushin et al., U.S. Pat. No. 6,670,645.

A passive matrix display was prepared using a portable substrate carrier as described herein. The display was formed on a glass sheet 152 mm×152 mm in size, having a layer of indium tin oxide using standard OLED processes. A hole injection layer comprised of polypyrrole complexed with a fluorinated sulfonic acid polymer was coated over the entire sheet and dried at 130 deg C. to a thickness of 180 nanometers. A hole transport layer comprised of crosslinkable hole transport polymer was coated onto the hole injection layer, over the entire layer, and cured at 200 deg C. to a thickness of 20 nanometers. This assembly was the substrate on which an air-sensitive material was to be deposited. The substrate was placed in the substrate enclosure shown in FIG. 1, and clamped via vacuum to the traveling stage of a continuous nozzle printer (Dai Nippon Screen). The enclosure was purged with nitrogen at a flow rate of 15 scfh. The enclosure was moved forward to the leading edge of the deposition stage where the nozzle printing occurs. The displaceable cover was moved back to uncover a first portion of the substrate. An emissive ink comprising an electroluminescent cyclometalated iridium complex in a mixture of toluene and 3,4-dimethylanisole was printed onto the hole transport layer of the first portion. The carrier was moved forward and the displaceable cover moved back further to uncover a second portion of the substrate. At the same time, the first portion of the substrate was moved under a stationary cover attached to the printing equipment. This process was repeated until all portions of the substrate had been printed. The substrate carrier was then moved back from the deposition stage while replacing the displaceable cover over the carrier support. The removable lid was then placed over the support, the gas flow was discontinued, and the lid valve close. The portable carrier enclosure containing the printed substrate was then moved to a nitrogen glove box where further processing took place. The display panel was baked at 105 C for 30 minutes under nitrogen. A cathode comprising 20 nanometers of tetrakis(8-hydroxyquinoline)zirconium, 1.5 nanometers of LiF, and 350 nanometers of aluminum was deposited. The display was encapsulated with a glass lid and epoxy.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. An assembly for depositing an air sensitive material onto a substrate, said assembly comprising
   a portable substrate carrier enclosure comprising
      a carrier support;
      a displaceable cover;
      spacers between the support and cover;
      a gas inlet;
      a removable lid including a valve;
   a material deposition device having a deposition stage, said deposition stage having a leading edge, a trailing edge, and two side edges, and
   a stationary cover attached to the material deposition device over the trailing edge of the deposition stage, wherein the portable substrate carrier enclosure is capable of moving through the material deposition device from the leading edge to the trailing edge.

2. The assembly of claim 1, comprising at least one gas curtain manifold on a side edge of the deposition stage.

3. The assembly of claim 2, comprising a gas curtain manifold on each side edge of the deposition stage.

* * * * *